US012794416B2

(12) United States Patent
Jiang et al.

(10) Patent No.: US 12,794,416 B2
(45) Date of Patent: Nov. 10, 2026

(54) OSCILLATOR FEEDTHROUGH MITIGATION FOR MULTIPLE MIXERS

(71) Applicant: Apple Inc., Cupertino, CA (US)

(72) Inventors: Haowei Jiang, San Diego, CA (US); Anandaroop Chakrabarti, San Jose, CA (US); Zhengan Yang, Del Mar, CA (US); Ming-Da Tsai, San Jose, CA (US)

(73) Assignee: Apple Inc., Cupertino, CA (US)

( * ) Notice: Subject to any disclaimer, the term of this patent is extended or adjusted under 35 U.S.C. 154(b) by 282 days.

(21) Appl. No.: 18/806,252

(22) Filed: Aug. 15, 2024

(65) Prior Publication Data

US 2026/0051850 A1 Feb. 19, 2026

(51) Int. Cl.
*H03D 7/12* (2006.01)
*H03H 11/28* (2006.01)

(52) U.S. Cl.
CPC ............... *H03D 7/12* (2013.01); *H03H 11/28* (2013.01)

(58) Field of Classification Search
CPC ................................. H03D 7/12; H03H 11/28
See application file for complete search history.

(56) References Cited

U.S. PATENT DOCUMENTS 3,659,206 A * 4/1972 Hallford .............. H03D 9/0633 455/326
6,862,441 B2 * 3/2005 Ella ........................ H03H 9/542 455/249.1

(Continued)

FOREIGN PATENT DOCUMENTS

CN 117674735 A 3/2024
EP 3804131 B1 * 5/2025 ........... H03G 3/3052

(Continued)

OTHER PUBLICATIONS

Jeng-Han Tsai, "Design of 1.2-V Broadband High Data-Rate MMW CMOS I/Q Modulator and Demodulator Using Modified Gilbert-Cell Mixer", IEEE Transactions on Microwave Theory and Techniques, May 2011, pp. 1350-1360, vol. 59, No. 5, IEEE.

(Continued)

*Primary Examiner* — Hai V Nguyen
(74) *Attorney, Agent, or Firm* — Treyz Law Group; Jason Tsai

(57) ABSTRACT

Circuitry is provided that includes a matching circuit, a first mixer coupled to the matching circuit and configured to receive a signal with an oscillation frequency, a second mixer coupled to the matching circuit, a first transmission line path coupled between the matching circuit and an input of the first mixer, and one or more capacitors coupled to the input of the first mixer and configured to reject signals at a harmonic frequency of the oscillation frequency. The wireless circuitry can further include a second transmission line path coupled between the matching circuit and an input of the second mixer. The transmission line path can include a first transmission line for conveying signals between the matching circuit and the first mixer, a second transmission line for conveying signals between the matching circuit and the first mixer, and a floating transmission line interposed between the first and second transmission lines.

20 Claims, 7 Drawing Sheets

(56) References Cited

U.S. PATENT DOCUMENTS

| | | | | |
|---|---|---|---|---|
| 7,299,006 | B1 * | 11/2007 | Rofougaran | H03D 3/244<br>455/190.1 |
| 7,558,556 | B1 * | 7/2009 | Moloudi | H04B 1/40<br>327/267 |
| 8,285,240 | B2 | 10/2012 | Seendripu et al. | |
| 8,803,615 | B2 * | 8/2014 | Cabanillas | H03F 1/565<br>330/305 |
| 9,071,197 | B2 | 6/2015 | Vora et al. | |
| 9,143,172 | B2 * | 9/2015 | See | H03F 3/24 |
| 9,197,257 | B2 * | 11/2015 | Axholt | H03D 7/1441 |
| 9,787,415 | B2 * | 10/2017 | Fan | H04B 1/525 |
| 10,009,050 | B2 * | 6/2018 | Chen | H04B 1/0475 |
| 10,027,358 | B2 | 7/2018 | Wu et al. | |
| 10,044,321 | B2 * | 8/2018 | Bhagavatula | H03D 7/1466 |
| 10,141,971 | B1 * | 11/2018 | Elkholy | H04B 7/2615 |
| 10,171,034 | B2 * | 1/2019 | Tseng | H03D 7/12 |
| 10,658,999 | B1 * | 5/2020 | Atalla | H03H 7/0115 |
| 10,763,787 | B2 * | 9/2020 | Zhu | H03D 7/166 |
| 10,797,647 | B1 * | 10/2020 | Mokhtari | H03D 7/1441 |
| 10,903,806 | B2 * | 1/2021 | Anderson | B82Y 10/00 |
| 10,951,190 | B2 * | 3/2021 | Atalla | H03F 3/189 |
| 10,971,789 | B2 * | 4/2021 | Gavryliuk | H01P 1/20327 |
| 11,271,597 | B1 * | 3/2022 | Huang | H03H 7/21 |
| 11,349,448 | B2 * | 5/2022 | Sun | H03F 3/245 |
| 11,356,136 | B2 * | 6/2022 | Emira | H04B 1/10 |
| 11,469,710 | B2 * | 10/2022 | Zhao | H03D 7/1458 |
| 11,502,717 | B2 * | 11/2022 | Sienko | H04B 1/40 |
| 11,764,738 | B2 * | 9/2023 | Esmael | H03F 3/211<br>330/296 |
| 12,395,126 | B2 * | 8/2025 | Elaasar | H03D 7/1466 |
| 12,418,267 | B2 * | 9/2025 | Elgousi | H03F 3/21 |
| 12,438,506 | B1 * | 10/2025 | Moody | H03B 19/10 |
| 12,483,278 | B2 * | 11/2025 | Chakraborty | H04B 1/0483 |
| 12,537,480 | B2 * | 1/2026 | Elaasar | H03B 5/1212 |
| 12,665,549 | B2 * | 6/2026 | Elaasar | H03D 7/1425 |
| 12,665,628 | B2 * | 6/2026 | Reggiannini | H04B 1/0475 |
| 12,671,457 | B2 * | 6/2026 | Elaasar | H04B 1/403 |
| 2004/0248614 | A1 * | 12/2004 | Ella | H03H 9/542<br>455/552.1 |
| 2005/0068146 | A1 * | 3/2005 | Jessie | H01F 17/0006<br>336/200 |
| 2005/0186930 | A1 * | 8/2005 | Rofougaran | H03H 21/0001<br>455/260 |
| 2007/0087704 | A1 * | 4/2007 | Gilberton | H03F 1/3247<br>455/114.3 |
| 2014/0349716 | A1 * | 11/2014 | Axholt | H04W 52/0261<br>455/571 |
| 2015/0056940 | A1 * | 2/2015 | Rangarajan | H03F 1/3205<br>455/311 |
| 2015/0068069 | A1 * | 3/2015 | Tran | A43B 13/183<br>340/693.1 |
| 2015/0340429 | A1 * | 11/2015 | McPartlin | H01Q 1/24<br>257/190 |
| 2017/0111029 | A1 * | 4/2017 | Karnstedt | G01R 25/00 |
| 2018/0048339 | A1 * | 2/2018 | Wu | H04B 1/1018 |
| 2018/0131333 | A1 * | 5/2018 | Cabanillas | H03F 1/0272 |
| 2020/0076032 | A1 * | 3/2020 | Gavryliuk | H01P 1/20327 |
| 2021/0013857 | A1 * | 1/2021 | Atalla | H03F 3/189 |
| 2021/0099148 | A1 * | 4/2021 | Sun | H03H 7/0115 |
| 2022/0278701 | A1 * | 9/2022 | Ayraud | H04B 1/0078 |
| 2022/0311461 | A1 * | 9/2022 | Eller | H03H 7/0115 |
| 2022/0376731 | A1 * | 11/2022 | Li | H04B 1/44 |
| 2023/0140378 | A1 * | 5/2023 | Pasha | H03D 7/12<br>455/326 |
| 2023/0198479 | A1 * | 6/2023 | Elgousi | H03F 1/26<br>330/250 |
| 2023/0283317 | A1 * | 9/2023 | Huang | H01F 38/04<br>455/552.1 |
| 2024/0007058 | A1 * | 1/2024 | Ayranci | H03F 1/565 |
| 2024/0022248 | A1 * | 1/2024 | Pellerano | G06N 10/40 |
| 2024/0039576 | A1 * | 2/2024 | Elaasar | H04B 1/403 |
| 2024/0088835 | A1 * | 3/2024 | Elaasar | H03D 7/1425 |
| 2024/0106445 | A1 * | 3/2024 | Singh | H03L 7/20 |
| 2024/0214016 | A1 * | 6/2024 | Patel | H03D 7/14 |
| 2024/0333333 | A1 * | 10/2024 | Elaasar | H04B 1/403 |
| 2024/0421768 | A1 * | 12/2024 | Darvishi | H03D 7/1441 |
| 2024/0421769 | A1 * | 12/2024 | Elaasar | H03D 7/1458 |
| 2025/0069800 | A1 * | 2/2025 | Jiang | H01F 27/40 |
| 2025/0350244 | A1 * | 11/2025 | Elaasar | H03D 7/1466 |
| 2025/0379601 | A1 * | 12/2025 | Singhal | H04B 1/0078 |

FOREIGN PATENT DOCUMENTS

| | | | | | |
|---|---|---|---|---|---|
| WO | 2013001743 | A1 | | 1/2013 | |
| WO | WO-2014043271 | A1 | * | 3/2014 | H03F 3/195 |
| WO | WO-2014145662 | A2 | * | 9/2014 | H03H 7/0153 |
| WO | WO-2015183847 | A1 | * | 12/2015 | H03F 1/223 |
| WO | 2020036641 | A1 | | 2/2020 | |
| WO | WO-2021262827 | A1 | * | 12/2021 | H01J 37/32174 |

OTHER PUBLICATIONS

Karthik Tripurari et al., "RF channelizer architectures using 3-way iterative down conversion for concurrent or fast-switching spectrum analysis", Analog Integrated Circuits and Signal Processing, May 11, 2016, pp. 185-206, Springer Science+Business Media, New York.

* cited by examiner

OSCILLATOR FEEDTHROUGH MITIGATION FOR MULTIPLE MIXERS

FIELD

This disclosure relates generally to electronic devices, including electronic devices with wireless communications circuitry.

BACKGROUND

Electronic devices are often provided with wireless communications capabilities. An electronic device with wireless communications capabilities has wireless communications circuitry with one or more antennas that are used to transmit radio-frequency signals and receive radio-frequency signals.

The wireless communications circuitry can include a transceiver having one or more mixers. A mixer in the transmit path can be used to modulate signals from a baseband frequency to a radio frequency, whereas a mixer in the receive path can be used to demodulate signals from the radio-frequency to the baseband frequency. Mixers receive clock signals generated from local oscillator circuitry. It can be challenging to design satisfactory mixers and local oscillator circuitry for an electronic device.

SUMMARY

An aspect of the disclosure provides wireless circuitry that includes an impedance matching circuit, a first mixer coupled to the impedance matching circuit and configured to receive an oscillating signal with an oscillation frequency, a second mixer coupled to the impedance matching circuit, a first transmission line path having a first end coupled to the impedance matching circuit and having a second end coupled to an input of the first mixer, and one or more harmonic rejection capacitors coupled to the input of the first mixer and configured to reject harmonic signals, at the input of the first mixer, with a harmonic frequency equal to an integer multiple of the oscillation frequency. The wireless circuitry can further include a second transmission line path having a first end coupled to the impedance matching circuit and having a second end coupled to an input of the second mixer. The first mixer can be configured to operate at a first frequency, whereas the second mixer can be configured to operate at a second frequency different than the first frequency.

An aspect of the disclosure provides wireless circuitry that includes an impedance matching circuit, a first mixer coupled to the impedance matching circuit and configured to receive an oscillating signal with an oscillation frequency, and a first transmission line path having a first end coupled to the impedance matching circuit and having a second end coupled to an input of the first mixer. The first transmission line path includes a first transmission line configured to convey a signal to the input of the first mixer, a second transmission line configured to convey a signal to the input of the first mixer, and a floating transmission line interposed between the first and second transmission lines and configured to reject signals with a frequency equal to a multiple of the oscillation frequency. The first transmission line path can further include a first shunt capacitor coupled to a first end of the floating transmission line and a second shunt capacitor coupled to a second end of the floating transmission line. The wireless circuitry can further include one or more filter capacitors coupled to the input of the first mixer and configured to filter signals at some multiple of the oscillation frequency.

An aspect of the disclosure provides circuitry that includes a matching network, a first mixer coupled to the matching network via a first transmission line path and configured to receive an oscillating signal, a second mixer coupled to the matching network via a second transmission line path, and one or more filter capacitors coupled to a node between the first mixer and the first transmission line path and configured to filter spurious signals, associated with the oscillating signal, at the node. The first transmission line path can include a first transmission line configured to convey a signal between the matching network and the first mixer, a second transmission line configured to convey a signal between the matching network and the first mixer, and a floating transmission line interposed between the first and second transmission lines and configured to filter spurious signals at the node.

DETAILED DESCRIPTION

Figure 1:
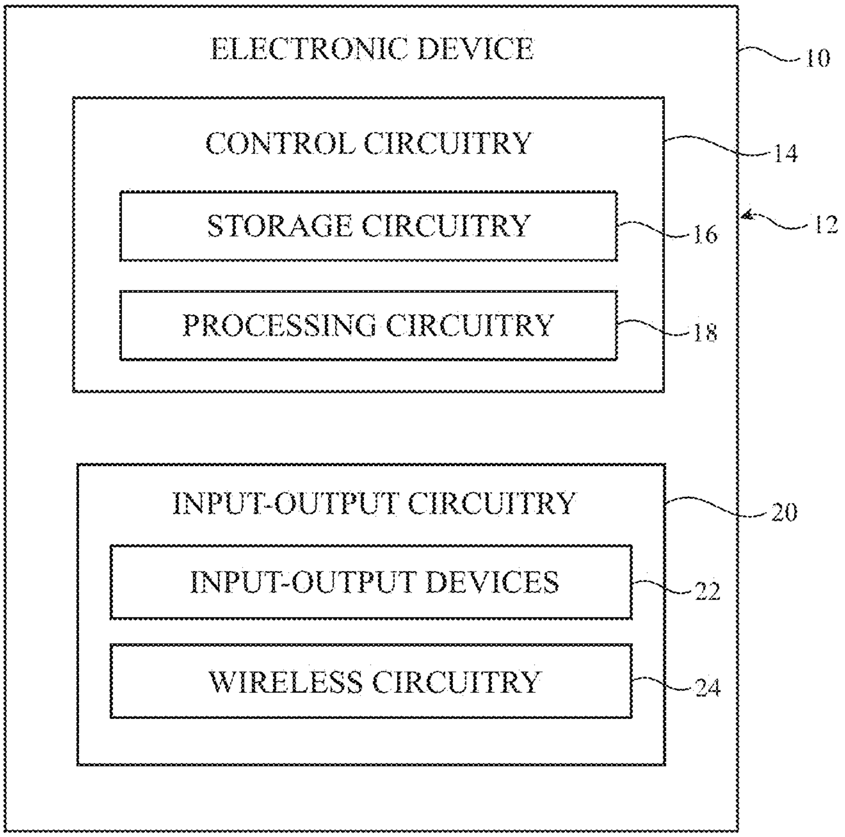
FIG. 1 is a diagram of an illustrative electronic device having wireless circuitry in accordance with some embodiments.

An electronic device such as electronic device 10 of FIG. 1 may be provided with wireless circuitry. The wireless circuitry may include one or more mixers such as a mixer in a transmit path for upconverting (modulating) signals from lower frequencies to higher frequencies and such as a mixer in a receive path for downconverting (demodulating) signals from higher frequencies to lower frequencies. A mixer can receive an oscillating (clock) signal from local oscillator (LO) circuitry.

In modern transceiver designs, multiple mixers for supporting different radio-frequency bands can be coupled to a common impedance matching network. The multiple mixers can be configured to convert signals between the same intermediate frequency (IF) and the different radio-frequency (RF) bands. In such arrangement, the matching network can be communicatively coupled to the multiple mixers via respect transmission line paths. In accordance with some embodiments, a capacitive filter can be coupled at the input (gate) of each mixer after the associated transmission line path. Additionally or alternatively, each transmission line path can optionally include a floating transmission line resonator. A transceiver configured in this way can be technically advantageous and beneficial to reduce (filter) undesired oscillator feedthrough for mixers sharing the same input matching network. In other words, undesired spurs or spectral emissions can be suppressed.

Electronic device 10 of FIG. 1 that can include such improved transceiver may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), Sixth Generation (6G) protocols, sub-THz protocols, THz protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), cellular sidebands, 6G bands between 100-1000 GHz (e.g., sub-THz, THz, or THF bands), etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
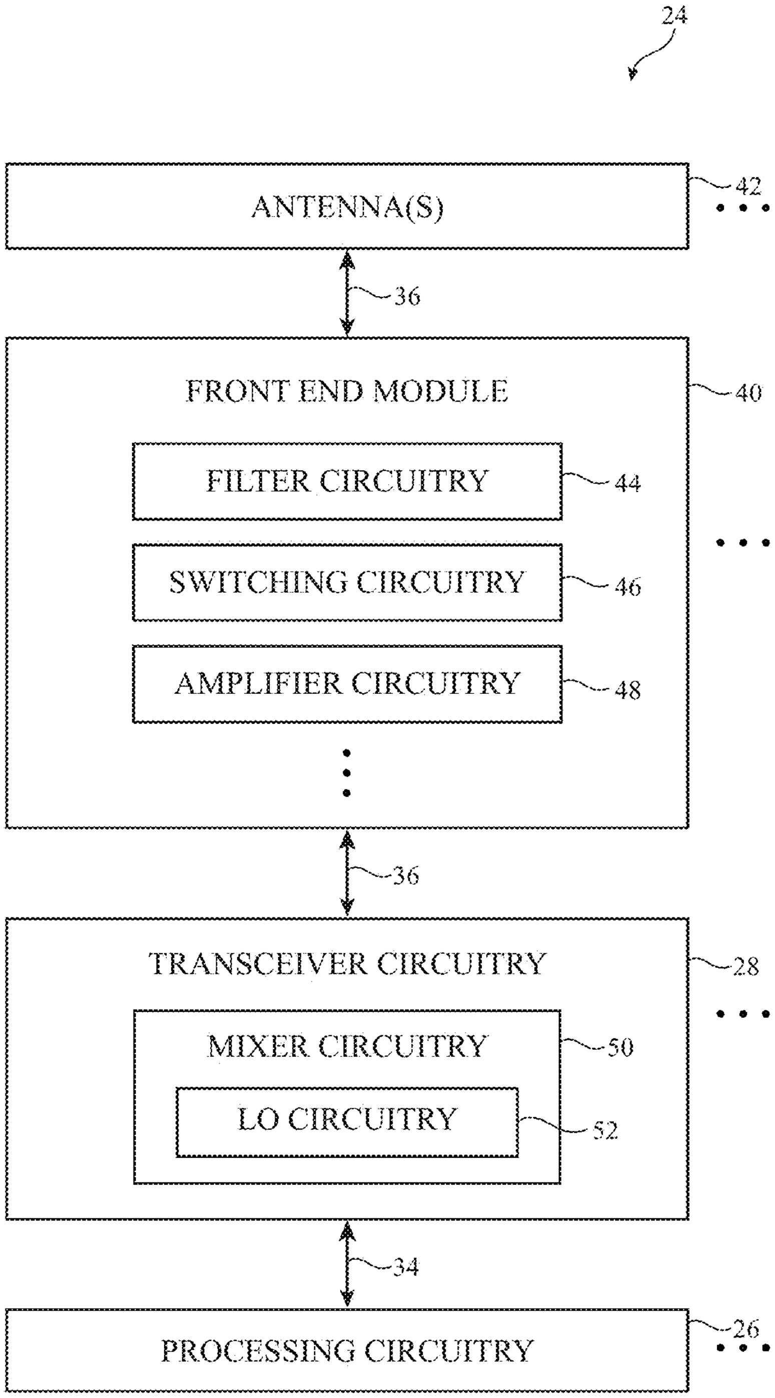
FIG. 2 is a diagram of illustrative wireless circuitry having a transceiver in accordance with some embodiments.

FIG. 2 is a diagram showing illustrative components within wireless circuitry 24. As shown in FIG. 2, wireless circuitry 24 may include processing circuitry such as processing circuitry 26, radio-frequency (RF) transceiver circuitry such as radio-frequency transceiver 28, radio-frequency front end circuitry such as radio-frequency front end module (FEM) 40, and antenna(s) 42. Processing circuitry 26 may include a baseband processor, an application processor, a digital signal processor, a microcontroller, a microprocessor, a central processing unit (CPU), a programmable device, a combination of these circuits, and/or one or more processors within circuitry 18. Processing circuitry 26 may be configured to generate digital (transmit or baseband) signals. Processing circuitry 26 may be coupled to transceiver 28 over path 34 (sometimes referred to as a baseband path). Transceiver 28 may be coupled to antenna 42 via radio-frequency transmission line path 36. Radio-frequency front end module 40 may be interposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processing unit 26, a single transceiver 28, a single front end module 40, and a single antenna 42 for the sake of clarity. In general, wireless circuitry 24 may include any desired number of processing units 26, any desired number of transceivers 28, any desired number of front end modules 40, and any desired number of antennas 42. Each processing unit 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module interposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), 6G bands between 100-1000 GHz (e.g., sub-THz, THz, or THF bands), etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processing circuitry 26 may provide digital signals to transceiver 28 over path 34. Transceiver 28 may further include circuitry for converting the baseband signals received from processing circuitry 26 into corresponding intermediate frequency or radio-frequency signals. For example, transceiver circuitry 28 may include mixer circuitry 50 for up-converting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for downconverting (or demodulating) the received radio-frequency signals to baseband frequencies prior to conveying the received signals to processing circuitry 26 over path 34. Mixer circuitry 50 can include local oscillator circuitry such as local oscillator (LO) circuitry 52. Local oscillator circuitry 52 can generate oscillator signals that mixer circuitry 50 uses to modulate transmitting signals from baseband frequencies to radio frequencies and/or to demodulate the received signals from radio frequencies to baseband frequencies.

Figure 3:
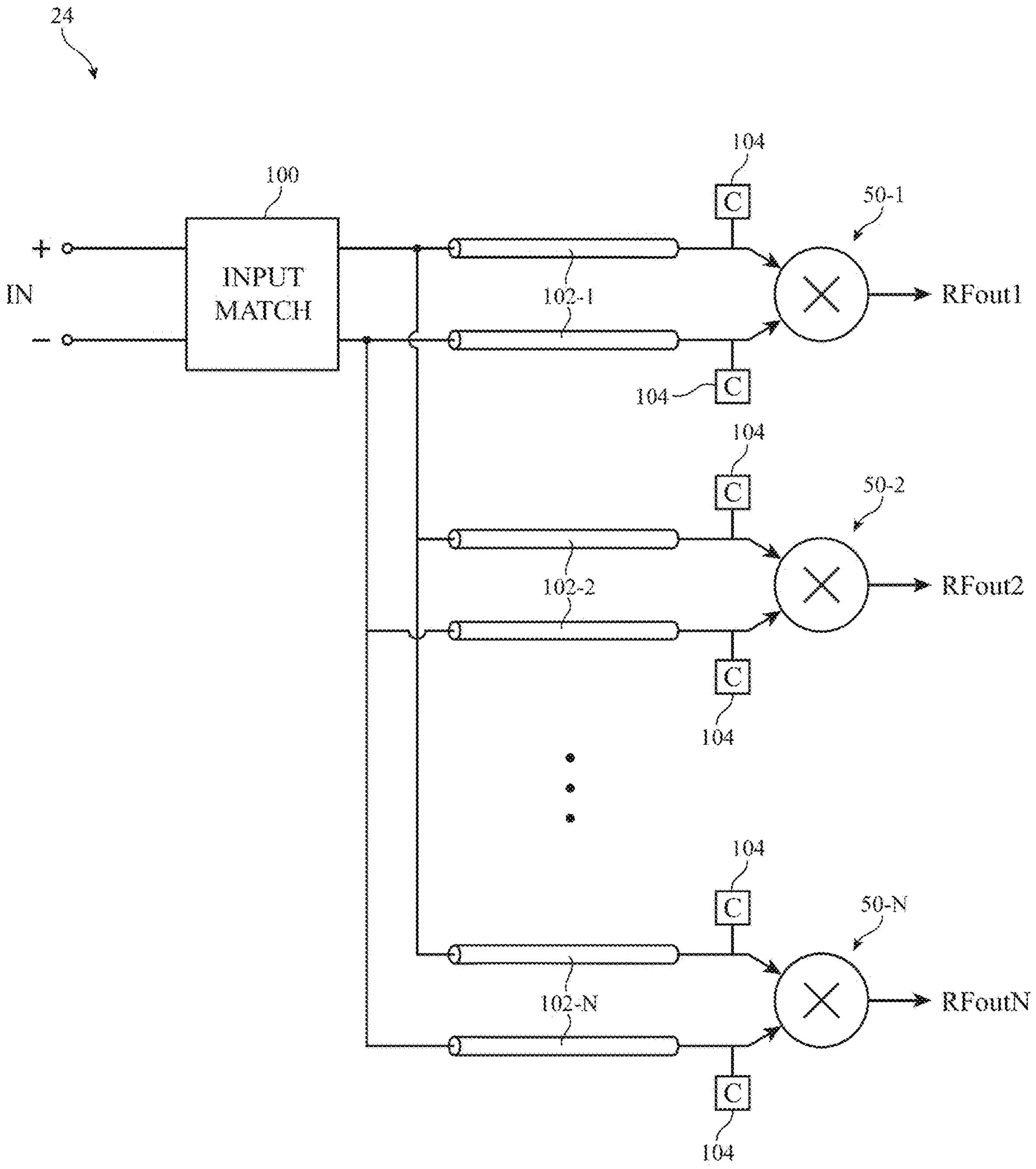
FIG. 3 is a diagram of illustrative transmit circuitry having an input matching network coupled to a plurality of mixers in accordance with some embodiments.

FIG. 3 is a diagram of illustrative wireless circuitry 24 having an input matching network such as input matching network 100 coupled to a plurality of mixers 50 in accordance with some embodiments. The circuitry shown in FIG. 3 can be part of a radio-frequency transmit path. As shown in FIG. 3, input matching network 100 can have an input IN and an output coupled to the plurality of mixers 50 via respective transmission line paths 102. Input matching network 100 is sometimes referred to as an impedance matching network (e.g., a circuit configured to provide impedance matching for optimum power transfer between different components along the transmit signal path). As examples, the input of matching network 100 can be coupled to an amplifier circuit, a data converter such as a digital-to-analog converter (DAC), another mixer circuit, or other transceiver component. Matching network 100 can, for example, be implemented as a transformer-based impedance matching network. Other types of matching networks can be employed, if desired.

As described above, the output of matching network 100 can be coupled to various mixers 50 via respective transmission line paths 102. In the example of FIG. 3, input matching network 100 can be coupled to a first mixer 50-1 via a first transmission line path 102-1, to a second mixer 50-2 via a second transmission line path 102-2, . . . , and to an $N^{th}$ mixer 50-N via transmission line path 102-N. The various mixers 50 can be upconversion mixers, sometimes referred to as modulators, configured to support different radio frequencies or frequency ranges (e.g., mixers 50 can be configured to operate at different frequencies). For example, mixer 50-1 can be configured to output signals in a first radio-frequency band RFout1; mixer 50-2 can be configured to output signals in a second radio-frequency band RFout2 different than RFout1; . . . , and mixer 50-N can be configured to output signals in yet another radio-frequency band RFoutN different than the other radio-frequency bands. In general, N can be equal to 2, 3, 4, 5, 6, 7, 8, 9, 10, 10-20, 20-50, 50-100, more than 100, or other integer value. Only one of the N mixers can be activated at any given point in time. The operation of the N mixers can optionally be interleaved in time (e.g., the various mixers 50 can be successively activated one at a time). Each of the N mixers 50 can be configured to receive LO signals of different frequencies. Configured in this way, each mixer 50 can be configured to upconvert signals from an intermediate frequency (IF) or a baseband (BB) frequency to a radio frequency.

A transmission line path 102 such as transmission line path 102-1 can include a pair of transmission lines configured to convey a differential signal. Such type of transmission line path 102 is thus sometimes referred to as a "differential" transmission line. A "transmission line path" can refer to and be defined herein as one or more transmission lines coupled between at least first and second nodes. The transmission line path conveys high frequency electromagnetic signals (e.g., radio-frequency signals at frequencies greater than or equal to around 20 kHz) between the at least first and second nodes with less than a threshold level of signal loss. A transmission line path is often terminated by one or more loads and/or impedance matching networks (e.g., at the at least first and second nodes) to prevent signal reflection and for reducing signal interference, degradation/distortion, and power loss (e.g., to help match impedances of the at least first and second nodes at radio frequencies to an impedance of the transmission line path such as a 50 ohm impedance). A transmission line includes at least a first conductor (e.g., a signal conductor) and a second conductor (e.g., a ground or reference conductor) extending between the at least first and second nodes (e.g., where the first and second conductors propagate electromagnetic waves at radio frequencies between the at least first and second nodes). A transmission line can include one or more shielding structures that provide electrical isolation from nearby circuitry and/or that help to facilitate the propagation of electromagnetic energy at radio-frequencies between the at least first and second nodes. Multiple transmission lines in the transmission line path may be coupled to each other using radio-frequencies connectors, radio-frequency signal couplers, radio-frequency signal splitters, and/or impedance matching circuitry. As examples, transmission line(s) in transmission line path 102 can include a strip line, a microstrip line, a coaxial cable, a twisted pair cable, a waveguide, a slotline, and/or other types of transmission lines. Not all signal lines are transmission lines. For instance, a generic signal wire that carries digital and/or analog signals at lower frequencies than around 20 kHz, that is not optimized for minimal signal loss at radio frequencies, and/or that is not properly terminated at radio frequencies is not a "transmission line" as defined herein.

The sharing of a common input matching network 100 among N mixers 50 necessitates the use of transmission line paths 102 for routing matching network 100 to the various mixers 50. Each of the N mixers 50 can receive oscillating signals from LO circuitry 52 (see FIG. 2). The oscillating signals received by the mixers 50 are sometimes referred to as LO signals. In practice, the LO signals can be inadvertently feed through to the inputs of each mixer 50, a phenomenon referred to herein as LO feedthrough or oscillator feedthrough. Such type of LO feedthrough, if not properly mitigated, can be problematic.

In accordance with some embodiments, wireless circuitry 24 can be provided with capacitors such as capacitors 104 coupled at the inputs of each mixer 50. As shown in FIG. 3, one or more capacitors 104 can be coupled at the interface between transmission line path 102-1 and mixer 50-1 (e.g., at the input of mixer 50-1). Similarly, one or more capacitors 104 can be coupled at the interface between transmission line path 102-1 and mixer 50-2 (e.g., at the input of mixer 50-2), and so on. Arranged in this way, capacitors 104 can form part of a lowpass filter circuit at the input of each mixer 50 for filtering out undesired spurious emissions at a harmonic of the LO frequency (e.g., at the second harmonic LO frequency or $2*f_{LO}$, where $f_{LO}$ is equal to the frequency of the LO signals). Frequency $f_{LO}$ can be referred to as the "fundamental" LO frequency or the oscillation frequency of the LO signal. Capacitors 104 can be configured to reduce the impedance at $2*f_{LO}$ or at other harmonic frequencies of $f_{LO}$. The term "harmonic" frequency can refer to herein as some integer multiple of the fundamental frequency $f_{LO}$ (e.g., $2*f_{LO}$ or second harmonic frequency, $3*f_{LO}$ or third harmonic frequency, $4*f_{LO}$ or fourth harmonic frequency, or other higher order harmonic frequencies). Capacitors 104 are thus sometimes referred to herein as "filter" or "harmonic rejection" capacitors.

Figure 4:
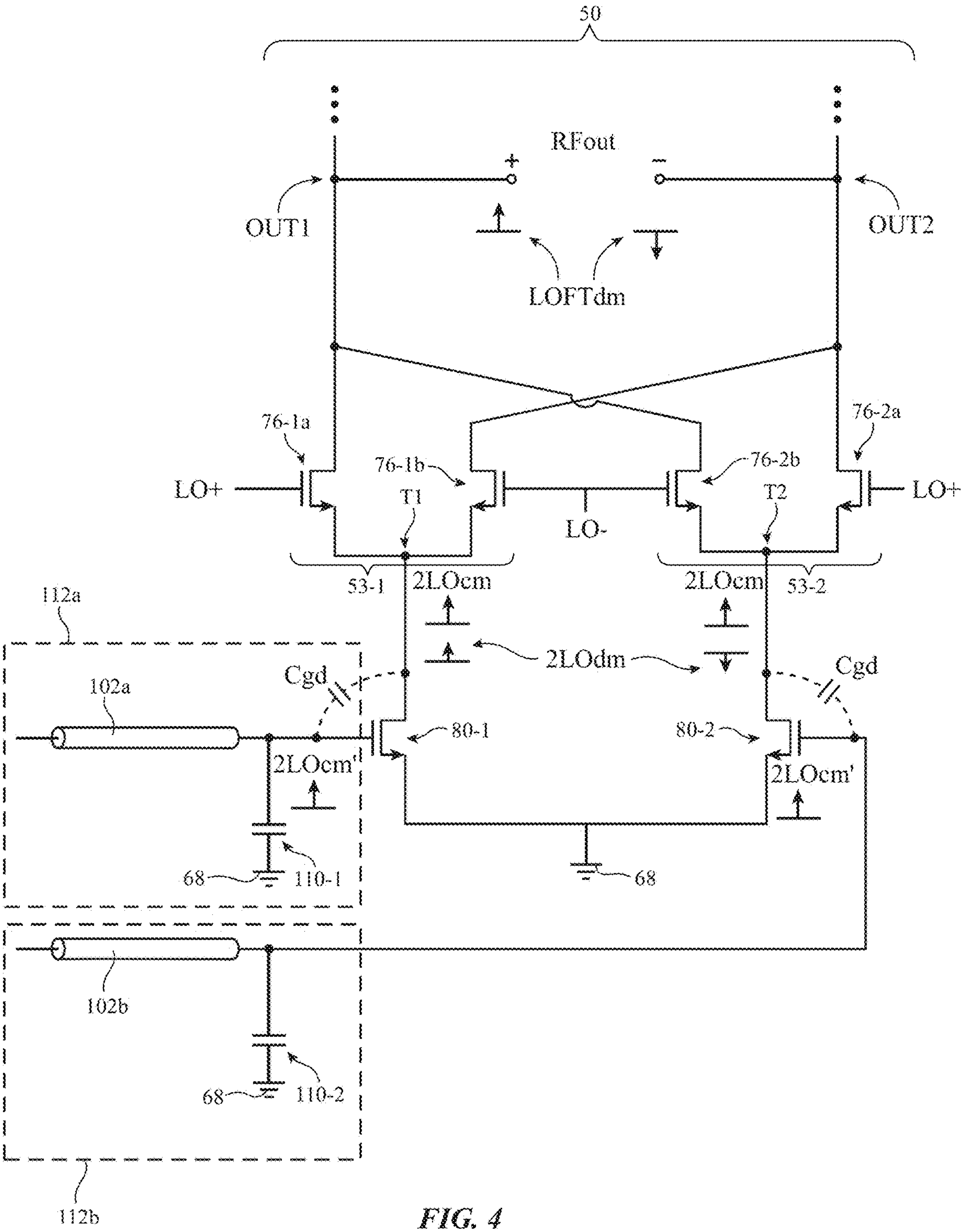
FIG. 4 is a circuit diagram of a mixer circuit coupled to a transmission line path in accordance with some embodiments.

FIG. 4 is a circuit diagram of a mixer 50 coupled to a transmission line path in accordance with some embodiments. Mixer circuit 50 of FIG. 4 can represent any one of the N mixers shown in FIG. 3. As shown in FIG. 4, mixer circuit 50 may include input transistors such as a first input transistor 80-1 and a second input transistor 80-2. Input transistors 80-1 and 80-2 can be n-type devices such as n-channel metal-oxide-semiconductor (NMOS) transistors. Input transistor 80-1 may have a drain terminal, a source terminal that is coupled to a ground power supply line 68 (e.g., a ground line on which a ground power supply voltage is provided), and a gate terminal that is coupled to a transmission line 102_a_ in the associated transmission line path 102.

At the other end, input transistor 80-2 may have a drain terminal, a source terminal that is coupled to ground line 68, and a gate terminal that is coupled to a transmission line 102_b_ in the associated transmission line path 102. The pair of transmission lines 102_a_ and 102_b_ shown in FIG. 4 can be considered part of a transmission line path 102. A high frequency differential signal (e.g., signals having frequencies greater than or equal to around 20 kHz) may be conveyed through the pair of transmission lines 102_a_ and 102_b_ to the input of mixer circuit 50. The gate terminals of input transistors 80-1 and 80-2 can serve as a differential input for mixer circuit 50. The terms "source" and "drain" terminals used to refer to current-conveying terminals in a transistor may be used interchangeably and are sometimes referred to as "source-drain" terminals. Thus, the drain terminal of transistor 80-1 can sometimes be referred to as a first source-drain terminal, and the source terminal of transistor 80-1 can be referred to as a second source-drain terminal (or vice versa).

The input transistors 80-1 and 80-2 can be coupled to mixer subcircuits 53-1 and 53-2. The first mixer subcircuit 53-1 can include a first pair of mixer transistors 76-1_a_ and 76-1_b_ (e.g., a first transistor pair). Mixer transistor 76-1_a_ may have a source terminal coupled to the drain terminal of input transistor 80-1, a gate terminal configured to receive oscillating signal LO+, and a drain terminal coupled to a first mixer output terminal OUT1. Mixer transistor 76-1_b_ may have a source terminal also coupled to the drain terminal of input transistor 80-1, a gate terminal configured to receive oscillating signal LO−, and a drain terminal that is cross-coupled to a second mixer output terminal OUT2. The source terminals of mixer transistors 76-1_a_ and 76-1_b_ may be coupled to a first tail node T1. Signals LO+ and LO− represent the positive and negative polarities of a differential signal and can collectively be referred to as a local oscillator signal or an oscillating signal. The gate terminals of mixer transistors 76-1_a_ and 76-1_b_ collectively form a differential input for receiving the oscillating signal. Output terminals OUT1 and OUT2 collectively form a differential output of mixer circuit 50. In general, an output load such as an output inductor, an output transformer, and/or other output component(s) can be coupled to the mixer output terminals OUT1 and OUT2.

At the other end, the second mixer subcircuit 53-2 can include a second pair of mixer transistors 76-2*a* and 76-2*b* (e.g., a second transistor pair). Mixer transistor 76-2*a* may have a source terminal coupled to the drain terminal of input transistor 80-2, a gate terminal configured to receive signal LO+, and a drain terminal coupled to the second output terminal OUT2. Mixer transistor 76-2*b* may have a source terminal also coupled to the drain terminal of input transistor 80-2, a gate terminal configured to receive signal LO−, and a drain terminal that is cross-coupled to the first output terminal OUT1. The source terminals of mixer transistors 76-2*a* and 76-2*b* may be coupled to a second tail node T2. The gate terminals of mixer transistors 76-2*a* and 76-2*b* collectively form a differential input for receiving the oscillating signal.

During normal wireless operation, the mixer subcircuits 53-1 and 53-2 can produce (due to non-linearities associated with the mixer transistors 76-1*a*, 76-1*b*, 76-2*a*, and 76-2*b*) spurious common mode (CM) signals at the second harmonic LO frequency at the source/tail nodes T1 and T2. These common mode signals are illustrated in FIG. 4 as signals 2LOcm at tail nodes T1 and T2. These common mode signals 2LOcm can inadvertently be coupled to the mixer input gate terminals through parasitic gate-to-drain capacitance Cgd associated with the input transistors 80-1 and 80-2. This coupling effect can be strong due to the series resonance formed by parasitic capacitance Cgd and the associated inductance of the input transmission lines 102*a* and 102*b*. Such common mode signals being coupled to the mixer input gates are illustrated in FIG. 4 as signals 2LOcm'.

The input transistors 80-1 and 80-2 of mixer circuit 50 can be configured as transconductance devices, sometimes referred to collectively as a "common source" stage or a "Gm" cell. These common mode signals 2LOcm' at the gate terminals of input transistors 80-1 and 80-2 can then be amplified by the common source stage, which produces corresponding differential signals at the second harmonic LO frequency, illustrated in FIG. 4 as signals 2LOdm at the drain terminals of the input transistors 80-1 and 80-2. Such differential signals 2LOdm can then mix with the LO signals to generate differential mode feedthrough signals LOFTdm at the output terminals of mixer circuit 50. If care is not taken, such type of differential mode LO feedthrough can be problematic.

In accordance with an embodiment, one or more capacitors such as capacitors 110 can be coupled at the mixer input gate terminals to selectively filter the undesired 2LOcm' that appear at the mixer input gate terminals. As shown in FIG. 4, a first capacitor 110-1 can be shunted at the gate terminal of input transistor 80-1, whereas a second capacitor 110-2 can be shunted at the gate terminal of input transistor 80-2. Capacitors 110-1 and 110-2 can represent the capacitors 104 shown in FIG. 3. In particular, capacitor 110-1 can have a first terminal directly coupled at the gate terminal of input transistor 80-1 and at the termination point of transmission line 102*a* and can have a second terminal shorted to ground 68. Similarly, capacitor 110-2 can have a first terminal directly coupled at the gate terminal of input transistor 80-2 and at the termination point of transmission line 102*b* and can have a second terminal shorted to ground 68. Capacitors 110-1 and 110-2 shorted to ground line 68 in this way can be referred to as "shunt" capacitors.

Connected in this way, shunt capacitor 110-1, transmission line 102*a* (e.g., the inductance of transmission line 102*a*), and parasitic capacitance Cgd of input transistor 80-1 can form a first filter circuit 112*a* configured to filter or otherwise reject signal 2LOcm' at the gate terminal of transistor 80-1. Capacitor 110-1 can be configured to provide a low impedance path for sinking signal 2LOcm' and can help break the LC resonance between the inductance of transmission line 102*a* and Cgd of transistor 80-1. At the other end, shunt capacitor 110-2, transmission line 102*b* (e.g., the inductance of transmission line 102*b*), and parasitic capacitance Cgd of input transistor 80-2 can form a second filter circuit 112*b* configured to filter or otherwise reject signal 2LOcm' at the gate terminal of transistor 80-2. Capacitor 110-2 can be configured to provide a low impedance path for sinking signal 2LOcm' and can help break the LC resonance between the inductance of transmission line 102*b* and Cgd of transistor 80-2. Capacitors 110-1 and 110-2 should have equal capacitance values. Capacitors 110-1 and 110-2 can be fixed capacitors or can be adjustable (tunable) capacitors.

Referring back to FIG. 3, the capacitance values for capacitors 104 for each mixer 50 can be the same or can be different. For example, the length or inductance of transmission line paths 102-1 and 102-2 can be different. In such scenarios, the shunt capacitors 104 terminating the first transmission line path 102-1 can each have a first capacitance value, whereas the shunt capacitors 104 terminating the second transmission line path 102-2 can each have a second capacitance value different than the first capacitance value. Alternatively, if the length or inductance of transmission line paths 102-1 and 102-2 are identical, then the shunt capacitors 104 terminating the first transmission line path 102-1 and the shunt capacitors 104 terminating the second transmission line path 102-2 can have equal capacitance values.

Figure 5:
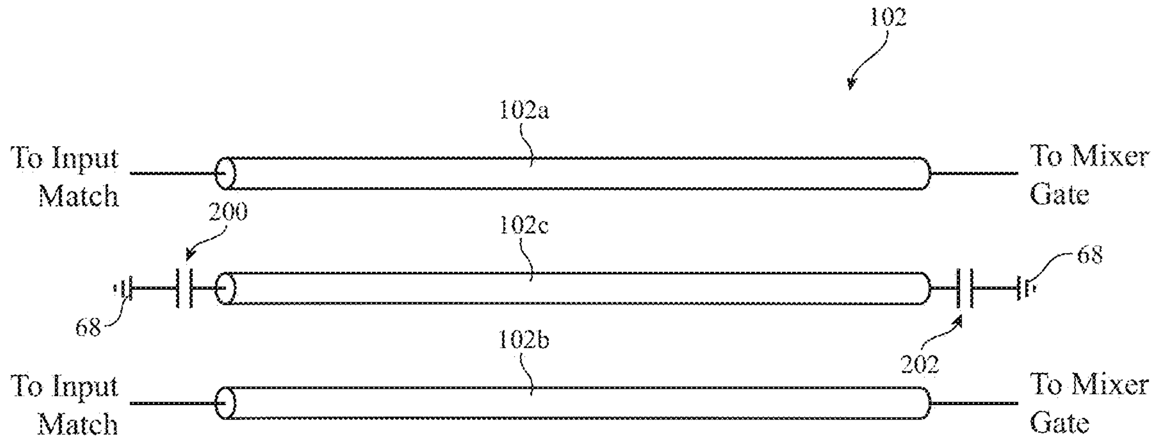
FIG. 5 is a diagram of an illustrative transmission line path having a floating transmission line resonator in accordance with some embodiments.

The embodiments described in connection with FIGS. 3 and 4 for mitigating LO feedthrough are exemplary. In accordance with another embodiment not mutually exclusive with any aforementioned embodiments, a transmission line path 102 that is coupled to a mixer circuit 50 can be provided with a floating transmission line interposed between the pair of differential transmission lines, as shown in FIG. 5. In the example of FIG. 5, transmission line path 102 can include a first transmission line 102*a*, a second transmission line 102*b*, and a third transmission line 102*c* interposed between the pair of transmission lines 102*a* and 102*b*. The first transmission line 102*a* can have a first distal terminal coupled to the input matching network 100 (see FIG. 2) and a second distal terminal coupled to a mixer gate (see, e.g., gate terminal of input transistor 80-1 in FIG. 3). The second transmission line 102*b* can have a first distal terminal coupled to input matching network 100 and a second distal terminal coupled to a mixer gate (see, e.g., gate terminal of input transistor 80-2 in FIG. 3).

The third transmission line 102*c* can have a first distal terminal coupled to a first shunt capacitor 200 and a second distal terminal coupled to a second shunt capacitor 202. Shunt capacitors 200 and 202 can be optional. Transmission line 102*c* is not configured to actively convey any high frequency signals and is thus sometimes referred to as a "floating" transmission line. Floating transmission line 102*c* can have similar lengths and/or inductances as transmission line 102*a* or 102*b*. Transmission lines 102*a*, 102*b*, and 102*c* can thus all extend along the same direction(s) and can be routed in parallel with one another. Arranged as such, floating transmission line 102*c*, and in particular its associated inductance, and the two shunt capacitors 200 and 202 can serve as a transmission line based resonator having a notch frequency selectively positioned at frequency $2*f_{LO}$ (e.g., to filter or reject signals 2LOcm' shown in FIG. 4). This is illustrative. Such type of transmission line based resonator that includes floating transmission line 102*c* can be configured to reject any harmonic LO frequency or other spurious signals. Transmission line 102*c*, and optionally capacitors 200 and 202, can thus sometimes be referred to collectively herein as a floating transmission line based resonator. Floating transmission line 102*c* being positioned between the active transmission lines 102*a* and 102*b* behaves like a differential mode virtual ground and thus has no impact to the differential mode performance of transmission line path 102. In analog (small) signal processing, the term "virtual ground" can refer to and be defined herein as a point in a circuit that is maintained at a stable voltage or reference level but is not physically connected to a ground line. The distance between transmission lines 102*a* and 102*c* should thus be equal to the distance between transmission lines 102*b* and 102*c*. Floating transmission line 102*c* can also be configured to reduce the common mode impedance at the output side of transmission line path 102.

Figure 6:
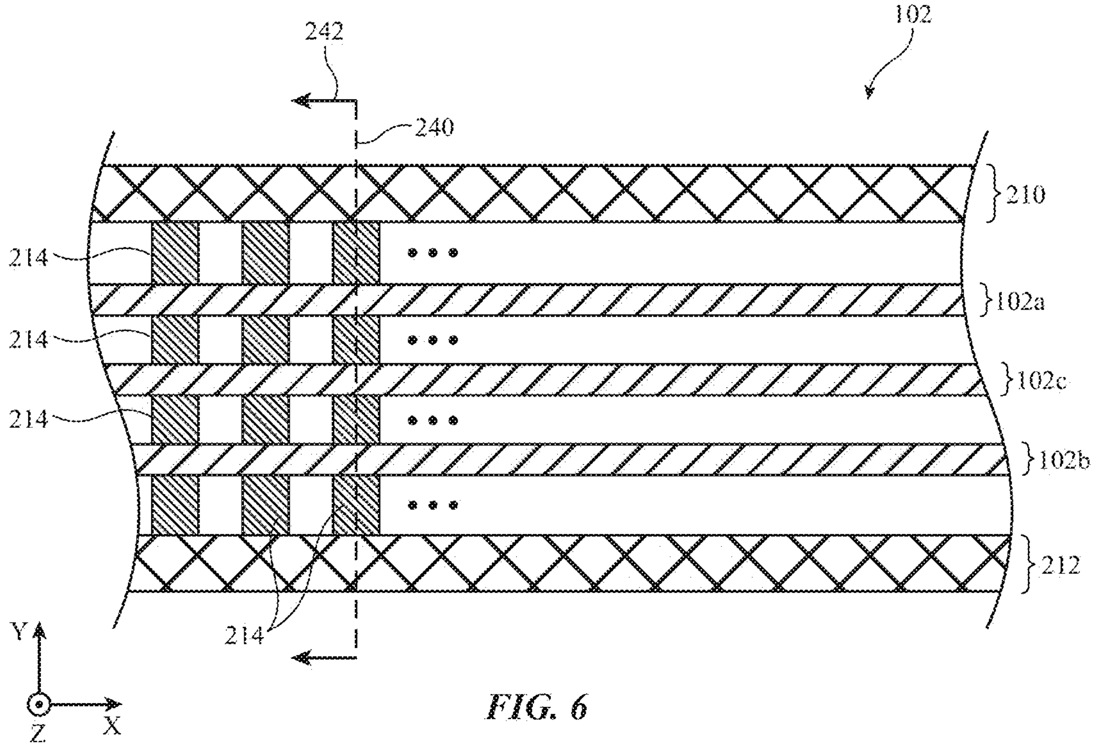
FIG. 6 is a top (plan) view of a transmission line path of the type shown in FIG. 5 with shielding structures in accordance with some embodiments.

FIG. 6 is a top (plan) view of transmission line path 102 of the type described in connection with FIG. 5. As shown in FIG. 6, transmission line path 102 can include straight transmission lines 102*a*, 102*b*, and 102*c* routed along the X direction. This is exemplary. If desired, transmission lines 102*a*, 102*b*, and 102*c* can have one or more turns or bends (e.g., transmission lines 102*a*, 102*b*, and 102*c* can have portions routed along the Y direction or in some other angle in the XY plane).

Transmission line path 102 can also include shielding structures such as shielding structures 210 and 212 flanking the transmission lines 102*a* and 102*b*. Shielding structures 210 and 212 can be configured as ground shielding structures (e.g., shielding conductors coupled to a ground power supply line) and/or can be configured as wall structures extending vertically along the Z direction. Transmission line path 102 can optionally further include additional shielding structures such as bridging structures 214 formed above and/or below the transmission lines 102*a*, 102*b*, and 102*c*. The bridging (bridge) structures 214 can be configured as ground bridge structures (e.g., shielding conductors coupled to the ground power supply line). The bridging structures 214 can be parallel bridge structures routed along the Y direction and having first ends coupled to shielding wall structure 210 and having second ends coupled to shielding wall structure 212. In other words, bridging structures 214 can extend orthogonally with respect to transmission lines 102*a*, 102*b*, and 102*c*. Arranged in this way, shielding wall structures 210 and 212 can laterally surround or shield the transmission lines 102*a*, 102*b*, and 102*c* from the sides, whereas shielding bridge structures 214 can surround or shield the transmission lines 102*a*, 102*b*, and 102*c* from above and/or below.

Figure 7:
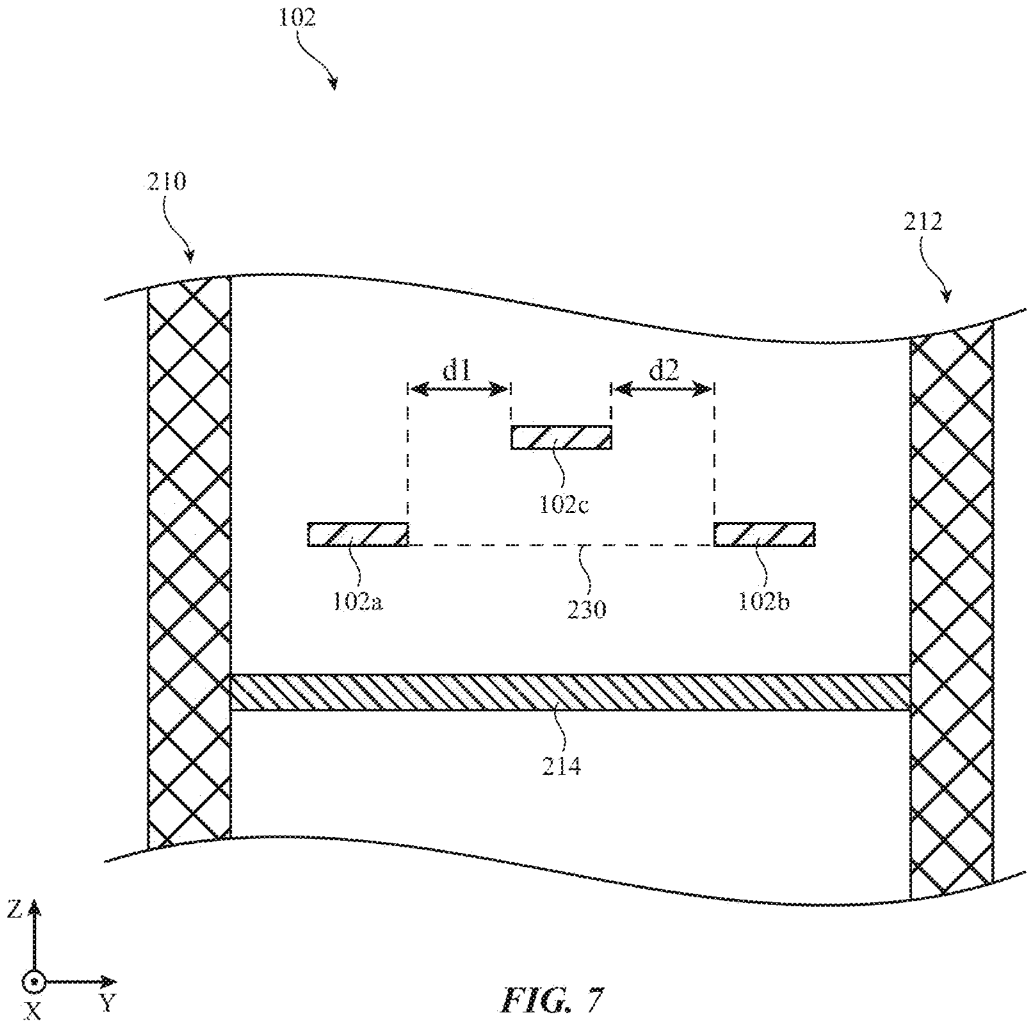
FIG. 7 is a cross-sectional side view of the transmission line path of FIG. 6 in accordance with some embodiments.

FIG. 7 is a cross-sectional side view of transmission line path 102 of the type described in connection with FIG. 6, cut along dotted line 240 and viewed in the direction of arrow 242. As shown in FIG. 7, wall structures 210 and 212 can extend vertically in the Z direction can provide lateral shielding for transmission lines 102*a*, 102*b*, and 102*c*. Bridge structures 214 an extend horizontally in the Y direction, with one end coupled to wall structure 210 and with an opposing end coupled to wall structure 212. The example of FIG. 7 in which bridge structure 214 is disposed below transmission lines 102*a*, 102*b*, and 102*c* is illustrative. Additionally or alternatively, a bridge structure 214 can be disposed above transmission lines 102*a*, 102*b*, and 102*c* for shielding purposes.

In the example of FIG. 7, the active transmission lines 102*a* and 102*b* can be disposed in the same horizontal plane (e.g., in the same XY plane 230). The intervening floating transmission line 102*c*, however, need not be disposed in the same horizontal plane 230. As shown in FIG. 7, floating transmission line 102*c* can be disposed above plane 230. This is illustrative. In other embodiments, floating transmission line 102*c* can be disposed in the same plane 230 or can be disposed below plane 230. Regardless, the distance d1 between transmission lines 102*a* and 102*c* should be equal to the distance d2 between transmission lines 102*b* and 102*c* so that floating transmission line 102*c* is configured to operate as a virtual ground line.

Figure 8:
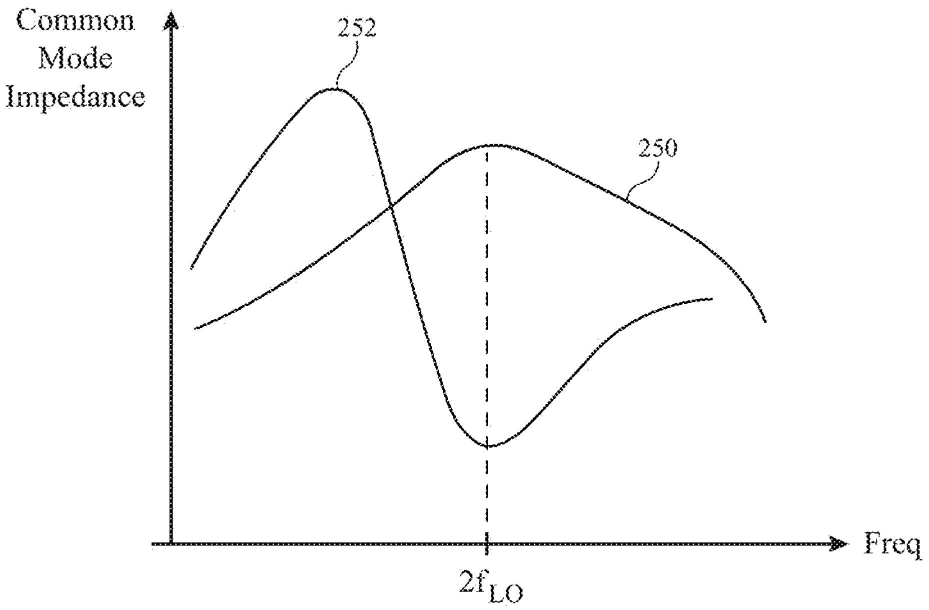
FIG. 8 is a diagram plotting common mode impedance as a function of frequency for various types of transmission line paths in accordance with some embodiments.

FIG. 8 is a diagram plotting the common mode (CM) impedance at the mixer input gate as a function of frequency for various types of transmission line paths. Curve 250 can represent the common mode impedance profile for a transmission line path that does not include any shunt capacitors at the mixer input gate (i.e., if capacitors 104 in FIG. 3 were to be omitted, or if capacitors 110-1 and 110-2 in FIG. 4 were to be omitted). Here, curve 250 might exhibit a relatively high common mode impedance at the second harmonic LO frequency ($2*f_{LO}$).

In contrast, curve 252 can represent the common mode impedance profile for transmission line path 102 of the type described in connection with FIGS. 1-7 (e.g., if capacitors 104 in FIG. 3 were included, if capacitors 110-1 and 110-2 in FIG. 4 were included, and/or if the floating transmission line based resonator of FIGS. 5-7 were included). Here, curve 252 can exhibit a relatively low common mode impedance at the second harmonic LO frequency. Providing a reduced common mode impedance at the mixer input gate in this way can be technically advantageous and beneficial to filter or otherwise mitigate undesired oscillator feedthrough for the overall wireless circuitry.

The methods and operations described above in connection with FIGS. 1-8 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users,

What is claimed is:

1. Wireless circuitry comprising:

an impedance matching circuit;

a first mixer coupled to the impedance matching circuit and configured to receive an oscillating signal with an oscillation frequency;

a second mixer coupled to the impedance matching circuit;

a first transmission line path having a first end coupled to the impedance matching circuit and having a second end coupled to an input of the first mixer; and one or more harmonic rejection capacitors coupled to the input of the first mixer and configured to reject harmonic signals, at the input of the first mixer, with a harmonic frequency equal to an integer multiple of the oscillation frequency.

2. The wireless circuitry of claim 1, further comprising:

a second transmission line path having a first end coupled to the impedance matching circuit and having a second end coupled to an input of the second mixer.

3. The wireless circuitry of claim 2, wherein the first transmission line path has a first length and wherein the second transmission line path has a second length different than the first length.

4. The wireless circuitry of claim 1, wherein the first mixer is configured to operate at a first frequency and wherein the second mixer is configured to operate at a second frequency different than the first frequency.

5. The wireless circuitry of claim 1, wherein:

the first mixer comprises a first input transistor and a second input transistor; and the harmonic rejection capacitors comprises a first harmonic rejection capacitor coupled to a gate terminal of the first input transistor and a second harmonic rejection capacitor coupled to a gate terminal of the second input transistor.

6. The wireless circuitry of claim 5, wherein the first and second harmonic rejection capacitors are shunted to a ground power supply line.

7. The wireless circuitry of claim 5, wherein the first transmission line path comprises:

a first transmission line having a first end coupled to the impedance matching circuit and a second end coupled to the gate terminal of the first input transistor; and a second transmission line having a first end coupled to the impedance matching circuit and a second end coupled to the gate terminal of the second input transistor.

8. The wireless circuitry of claim 7, wherein the first transmission line path further comprises:

a third transmission line interposed between the first transmission line and the second transmission line.

9. The wireless circuitry of claim 8, wherein the third transmission line comprises a floating transmission line configured to operate as a virtual ground.

10. The wireless circuitry of claim 8, wherein the first transmission line path further comprises:

a first shunt capacitor coupled to a first end of the third transmission line; and a second shunt capacitor coupled to a second end of the third transmission line.

11. The wireless circuitry of claim 8, wherein the first transmission line path further comprises:

first and second shielding wall structures, wherein the first, second, and third transmission lines are disposed between the first and second shielding wall structures; and a plurality of shielding bridge structures, wherein each shielding bridge structure in the plurality of shielding bridge structures extends from the first shielding wall structure to the second shielding wall structure in a direction that is orthogonal to the first transmission line.

12. The wireless circuitry of claim 8, wherein:

the first transmission line and the third transmission line are separated by a first distance; and the second transmission line and the third transmission line are separated by a second distance equal to the first distance.

13. The wireless circuitry of claim 8, wherein:

the first and second transmission lines are formed in a plane; and the third transmission line is disposed above or below the plane.

14. Wireless circuitry comprising:

an impedance matching circuit;

a first mixer coupled to the impedance matching circuit and configured to receive an oscillating signal with an oscillation frequency; and a first transmission line path having a first end coupled to the impedance matching circuit and having a second end coupled to an input of the first mixer, wherein the first transmission line path comprises:

a first transmission line configured to convey a signal to the input of the first mixer;

a second transmission line configured to convey a signal to the input of the first mixer; and a floating transmission line interposed between the first and second transmission lines and configured to reject signals with a frequency equal to a multiple of the oscillation frequency.

15. The wireless circuitry of claim 14, further comprising:

a second mixer coupled to the impedance matching circuit; and a second transmission line path having a first end coupled to the impedance matching circuit and having a second end coupled to an input of the second mixer.

16. The wireless circuitry of claim 14, wherein the first transmission line path further comprises:

a first shunt capacitor coupled to a first end of the floating transmission line; and a second shunt capacitor coupled to a second end of the floating transmission line.

17. The wireless circuitry of claim 14, wherein:

the first transmission line and the floating transmission line are separated by a first distance; and the second transmission line and the floating transmission line are separated by a second distance equal to the first distance.

18. The wireless circuitry of claim 14, further comprising:

one or more filter capacitors coupled to the input of the first mixer and configured to filter signals at some multiple of the oscillation frequency.

19. Circuitry comprising:

a matching network;

a first mixer coupled to the matching network via a first transmission line path and configured to receive an oscillating signal;

a second mixer coupled to the matching network via a second transmission line path; and one or more filter capacitors coupled to a node between the first mixer and the first transmission line path and configured to filter spurious signals, associated with the oscillating signal, at the node.

20. The circuitry of claim 19, wherein the first transmission line path comprises:

a first transmission line configured to convey a signal between the matching network and the first mixer;

a second transmission line configured to convey a signal between the matching network and the first mixer; and a floating transmission line interposed between the first and second transmission lines and configured to filter spurious signals at the node.

* * * * *